US012326519B2

(12) United States Patent
Onat et al.

(10) Patent No.: US 12,326,519 B2
(45) Date of Patent: Jun. 10, 2025

(54) RESPONSIVITY ENHANCED PHOTODETECTOR WITH PHOTON-TRAPPING NANOSTRUCTURES

(71) Applicant: Attollo Engineering, LLC, Camarillo, CA (US)

(72) Inventors: Bora Onat, Camarillo, CA (US); M. Saif Islam, Davis, CA (US)

(73) Assignee: Attollo Engineering, LLC, Camarillo, CA (US)

( * ) Notice: Subject to any disclaimer, the term of this patent is extended or adjusted under 35 U.S.C. 154(b) by 0 days.

(21) Appl. No.: 18/223,481

(22) Filed: Jul. 18, 2023

(65) Prior Publication Data

US 2025/0028030 A1 Jan. 23, 2025

(51) Int. Cl.
| | |
|---|---|
| G01S 7/481 | (2006.01) |
| G01S 17/89 | (2020.01) |
| H10F 39/00 | (2025.01) |
| H10F 39/12 | (2025.01) |
| H10F 39/18 | (2025.01) |

(52) U.S. Cl.
CPC .......... G01S 7/4816 (2013.01); H10F 39/184 (2025.01); H10F 39/199 (2025.01); H10F 39/806 (2025.01); H10F 39/8063 (2025.01); G01S 17/89 (2013.01)

(58) Field of Classification Search
CPC . G01S 7/4816; G01S 17/89; H01L 27/14625; H01L 27/14627; H01L 27/1464; H01L 27/14649
See application file for complete search history.

(56) References Cited

U.S. PATENT DOCUMENTS

| | | | |
|---|---|---|---|
| 2011/0220171 A1* | 9/2011 | Mathai | H01L 31/0352 438/66 |
| 2013/0014814 A1* | 1/2013 | Han | H01L 31/035209 136/255 |
| 2016/0308075 A1* | 10/2016 | Wang | H01L 27/1446 |
| 2018/0102442 A1* | 4/2018 | Wang | H01L 31/02327 |
| 2022/0149098 A1* | 5/2022 | Wang | H01L 27/1463 |

FOREIGN PATENT DOCUMENTS

WO WO-2022061016 A1 * 3/2022 ............ G01J 1/0209

OTHER PUBLICATIONS

Cansizoglu, Hilal et al. "Dramatically Enhanced Efficiency in Ultra-Fast Silicon MSM Photodiodes Via Light Trapping Structures." IEEE photonics technology letters 31.20 (2019): 1619-1622 (Year: 2019).*

(Continued)

Primary Examiner — Georgia Y Epps
Assistant Examiner — Monica T Taba
(74) Attorney, Agent, or Firm — Billion & Armitage (57) ABSTRACT

A back-illuminated photo detector array (PDA) includes a front side and a back side. The back side receives optical energy incident on the back side at an incident direction. The front side includes a detection layer that includes detection structures and a plurality of photon-trapping nanostructures (PTN). The PTN cause optical energy incident on the back side to disperse in a direction perpendicular to the incident direction, and thereby improve an absorption efficiency of the back-illuminated PDA.

21 Claims, 9 Drawing Sheets

(56) References Cited

OTHER PUBLICATIONS

Cansizoglu, Hilal et al. "Surface-Illuminated Photon-Trapping High-Speed Ge-on-Si Photodiodes with Improved Efficiency up to 1700 Nm." Photonics research (Washington, DC) 6.7 (2018): 734 (Year: 2018).*
Cansizoglu, Hilal et al. "A New Paradigm in High-Speed and High-Efficiency Silicon Photodiodes for Communication—Part II: Device and VLSI Integration Challenges for Low-Dimensional Structures." IEEE transactions on electron devices 65.2 (2018): 382-391 (Year: 2018).*
Donnelly, J. P., et al., "Design Considerations for 1.06um InGaAsP-InP Geiger-Mode Avalanche Photodiodes", IEEE Journal of Quantum Electronics, vol. 42, No. 8, pp. 797-809, Aug. 2006, doi: 10.1109/JQE.2006.877300., 13 pages.
Gao, Y., et al., "A High Speed Surface Illuminated Si Photodiode using Microstructured Holes for Absorption Enhancements at 900-1000 nm Wavelength", ACS Photonics 4 (8), p. 2053, 2018.
Gao, Y., et al., "Photon-trapping microstructures enable high-speed high-efficiency silicon photodiodes", Nat. Photonics, 2017, doi: 10.1038/nphoton.2017.37, 9 pages.
Tzler, M. A., et al., "Single-photon detectors based on InP avalanche diodes: status and prospects", Proc. SPIE 7681, Advanced Photon Counting Techniques IV, 76810V (2010), 13 pages.

* cited by examiner

RESPONSIVITY ENHANCED PHOTODETECTOR WITH PHOTON-TRAPPING NANOSTRUCTURES

BACKGROUND

Optical imaging technologies, such as 3-D imaging or Light Detection and Ranging (LIDAR) sensors, are highly useful for many military, commercial, and other applications. For example, LIDAR is commonly used to make high-resolution maps, with applications in surveying, geodesy, geomatics, archaeology, geography, geology, geomorphology, seismology, forestry, atmospheric physics, laser guidance, airborne laser swath mapping (ALSM), and laser altimetry. LIDAR is also commonly used in autonomous vehicles, robot vacuums, and other commercial and industrial applications.

LIDAR uses active sensors that supply their own illumination source. The energy source emits optical energy towards objects and the reflected energy is detected and measured by a photo detector. Distance to the object, also referred to as Time of Flight "TOF," is determined by recording the time between transmitted and backscattered pulses and by using the speed of light to calculate the distance traveled. TOF, measured for multiple point sources of energy by a photodetector array, can be used with other information to generate a point cloud representation of an object or environment.

A need exists for improvements in photodetector arrays to reduce the cost and difficulty associated with manufacturing accurate sensors for LIDAR and other 3D imaging technologies.

SUMMARY

Improvements in photodetector arrays for use in advanced imaging systems are described. According to some embodiments, a back-illuminated photo detector array (PDA) includes a front side and a back side. The back side receives optical energy incident on the back side at an incident direction. The front side includes a detection layer that includes detection structures and a plurality of photon-trapping nanostructures (PTN). The PTN cause optical energy incident on the back side to disperse in a direction perpendicular to the incident direction, and thereby improve an absorption efficiency of the back-illuminated PDA.

According to some embodiments, the detection layer includes a plurality of detection structures, and fill regions between adjacent detection structures. The fill regions include the plurality of PTN, which cause optical energy incident on the fill region to disperse in a direction perpendicular to the incident direction toward the detection structures.

According to other embodiments, the detection layer of a back-illuminated PDA includes a plurality of PTN in an absorber layer of the plurality of detection structures. According to these embodiments, the PTN cause optical energy incident on the detection structures to disperse in a direction perpendicular to the incident direction such that the absorber layer absorbs more energy.

According to still other embodiments, the detection layer includes a first plurality of PTN in the absorber layer of the plurality of detection structures, and a second plurality of PTN in the fill regions between adjacent detection structures. According to these embodiments, the first and second pluralities of PTN used in combination may provide even further improvements to absorption efficiency of the PDA.

According to still other embodiments, a front-illuminated PDA is described. The PDA includes a back side that includes a substrate, and a front side that includes a detection layer that absorbs the optical energy incident on the front side. The detection layer includes a plurality of detector structures and fill regions between adjacent detector structures. The fill regions include a plurality of PTN, which cause optical energy received at the fill region to disperse in a direction perpendicular to the incident direction to be absorbed by an absorber layer of the plurality of detector structures. According to some embodiments, the front-illuminated PDA further includes another plurality of PTN in the absorber layer.

DETAILED DESCRIPTION

Figure 1:
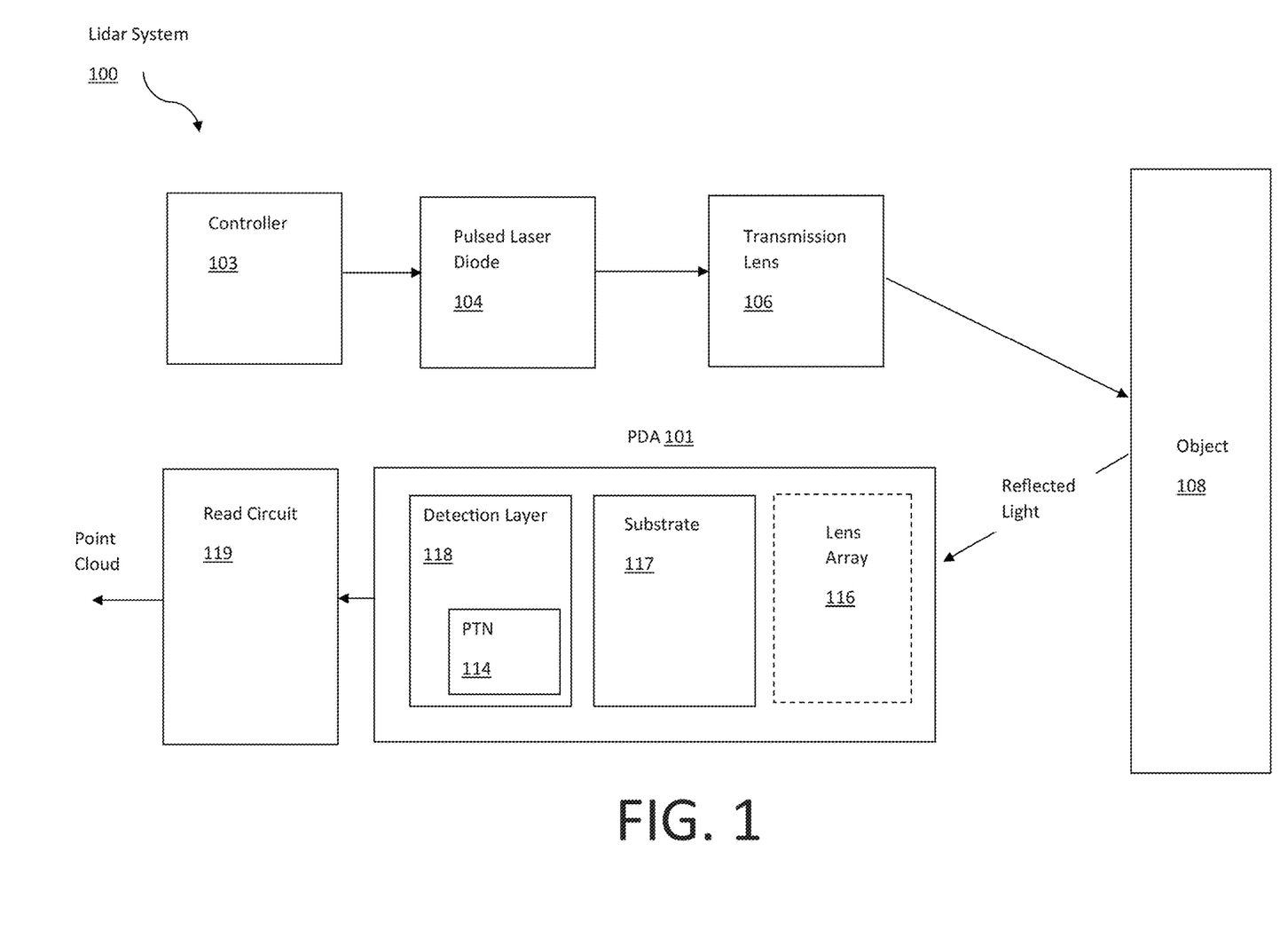
FIG. 1 is a block diagram that depicts one example of a LIDAR system according to one or more embodiments.

FIG. 1 is a block diagram that depicts one example of a (Light Detection and Ranging) LIDAR system 100 that includes at least one plurality of photon-trapping nanostructures (PTN) 114 according to one or more aspects of this disclosure. As described with respect to the various embodiments of this application, by incorporating PTN 114 that cause light to disperse perpendicularly, LIDAR system 100 may be produced with lower cost, operate with improved performance, and/or be useable in a greater number of military, consumer, industrial, and research applications than traditional LIDAR systems.

As shown in FIG. 1, LIDAR system 100 includes a Photo Detector Array (PDA) 101 that includes PTN 114. According to the various embodiments described herein, PDA 101 may be a back-illuminated or front-illuminated. Incorporating PTN 114 within PDA 101 may improve the absorption efficiency of PDA 101, and therefore improve the performance of LIDAR system 100 to perform 3D mapping. The various improvements described herein may therefore enable LIDAR system 100 to be produced with either improved functionality to generate 3D depth maps, and/or to enable accurate LIDAR systems 100 to be produced at lower cost (e.g., without components such as focusing apparatuses, or the like).

According to some embodiments, PDA 101 is a back-illuminated PDA, and incorporating PTN 114 may obviate a need for one or more costly and/or difficult to manufacture components included in traditional photo detectors, thereby reducing the overall cost to produce an accurate LIDAR system 100. For example, utilizing PTN 114 to redirect incident light to disperse in a perpendicular direction (e.g., perpendicular to a direction of the incident light) may obviate a need for a costly micro-lens array 116 at the back side of the PDA 101. According to still other examples, incorporating PTN 114 may enable PDA 101 to offer accurate performance with less complexity to manufacture and/or cost.

LIDAR system 100 generates a 3D map of an environment by directing optical energy towards one or more surfaces in a scene and detecting reflections of the directed light. As shown in the example of FIG. 1, LIDAR system 100 includes a controller 103, one or more pulsed laser diode(s) 104, and transmission lens 106. Controller 103 includes any combination of electrical circuitry, firmware, software, of the like that controls operation of pulsed laser diode 104, transmission lens 106, and/or other components not depicted in FIG. 1 to illuminate surfaces with in an environment with multiple distinct points of optical energy, which may be referred to as a point sources of optical energy. For example, controller 103 may control pulsed laser diode(s) 104 to generate pulses of laser energy and use transmission lens 106 to generate a backscattered pattern of point sources of light directed at the environment to be scanned. In some examples, although not depicted in FIG. 1, LIDAR system 100 further includes one or more micromechanical machines (MEMS) devices, beam splitters, mirrors, waveguides, or the like that are used to generate an appropriate illumination pattern of point sources for the particular application and environment to be scanned.

As shown in FIG. 1, LIDAR system 100 also includes a photo detector array (PDA) 101 according to one or more aspects of this disclosure. In some examples, PDA 101 is an avalanche photo detector, particularly useful in some LIDAR applications due to an ability to multiply, or amplify, detected optical energy. In other examples, the embodiments described herein may be applied to PDA 101 that incorporate any other "Mesa type" photodetector array, for example PIN, Schottky Solar cells, nBn, or other type of photodetector. In operation, PDA 101 receives optical energy reflected from object 108 incident on a surface of the PDA 101. The incident optical energy, made up of photons, is absorbed by a detection layer 118, which generates electrical signals in response to the absorbed optical energy. Read circuitry 119 is coupled to the detection layer 118 to read the electrical signals and convert them to digital values. Downstream circuitry and/or software (not shown in FIG. 1), may use the digital values from read circuitry 119 to identify a source of reflected light. By understanding the source of reflected light, i.e., when and where a point source was generated and output by LIDAR system 100, a "time of flight" (TOF) between transmission and detection can be determined for each point of optical energy detected by PDA 101. The TOF values can be processed to determine characteristics of moving and/or stationary objects within a field of view of LIDAR system 100.

Figure 2:
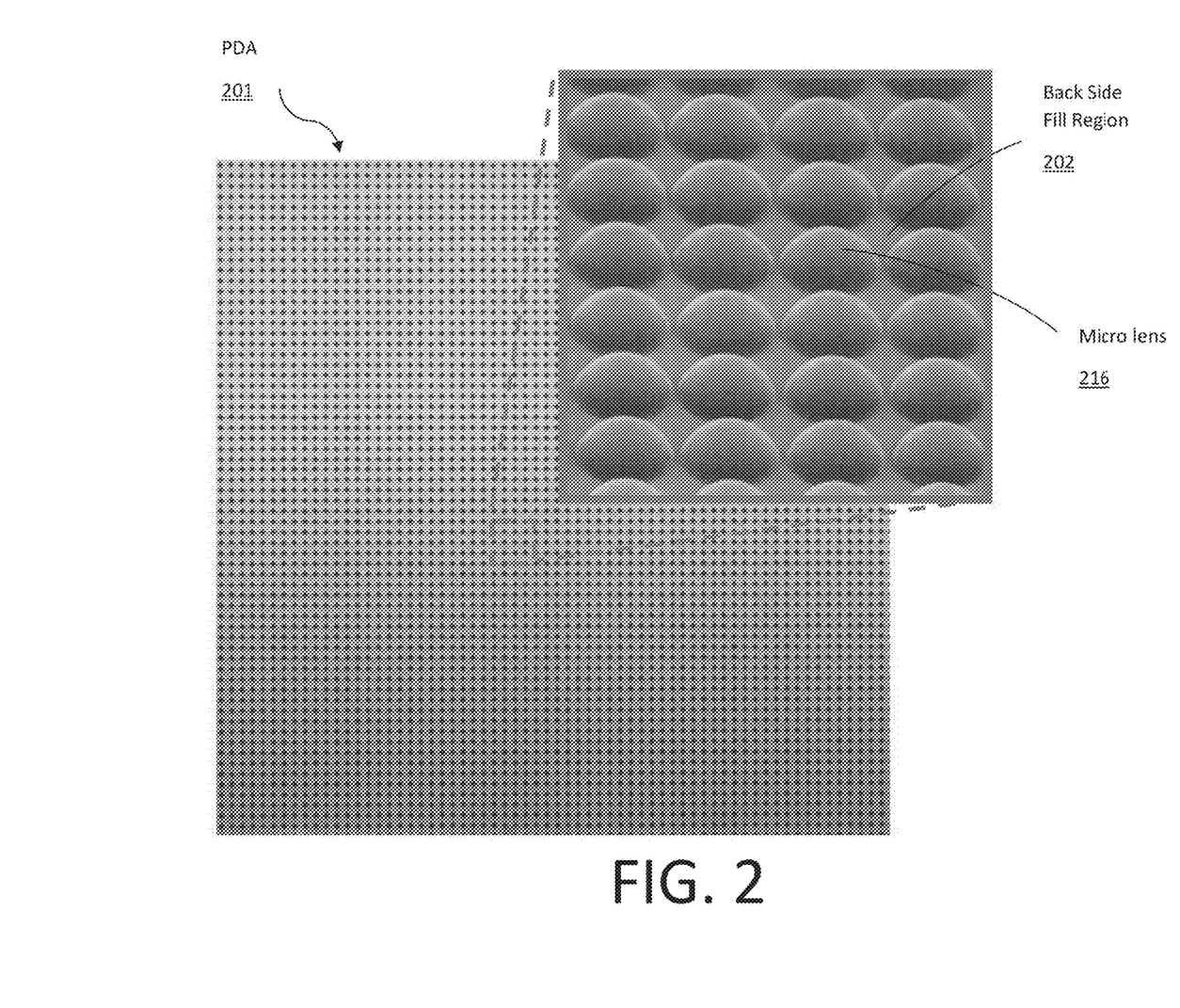
FIG. 2 is a diagram showing a top-down perspective view of a photo detector array (PDA) according to one or more embodiments.

FIG. 2 is a diagram depicting a top-down perspective view of the back side of a back-illuminated PDA 201 according to one or more aspects of this disclosure. The example of FIG. 2 shows an array of micro-lenses 216 at the back side, each of which are arranged to direct incident light to an array of photo detector structures (not shown in FIG. 2) directly beneath each micro-lens. According to PDA 201, a detection layer 118 (not shown in FIG. 2) includes photo detector structures in spaced arrangement across a substrate, with a fill region between each adjacent detector structure. In the example of FIG. 2, back side fill regions 202, including surfaces around each micro-lens 216 may correspond to the fill regions, meaning light incident on the back side fill regions passes through to and reaches the fill regions.

One issue with traditional PDA is that light incident on the fill regions passes through PDA 201 without being detected, thereby negatively impacting the efficiency of the PDA 201 to absorb and therefore detect incident optical energy. To reduce the impact caused by light passing through the fill region, traditional PDA include one or more additional structures at a back side of the PDA 201, such as micro-lens array 216 as depicted in FIGS. 2, to direct incident light to the detector structures.

Micro-lens arrays 216 may increase the cost and complexity of producing accurate PDA according to traditional techniques, because these components are costly to produce with required alignment accuracy. Micro-lens arrays 216 are typically made as a separate integrated circuit, and must be securely affixed to the PDA 201 substrate, which may require costly and time-consuming curing processes. In addition, before micro-lens array 216 can be securely affixed, it must be carefully calibrated using active alignment (e.g., based on illumination from an active light source), which may require a significant amount of manual effort.

Figure 3:
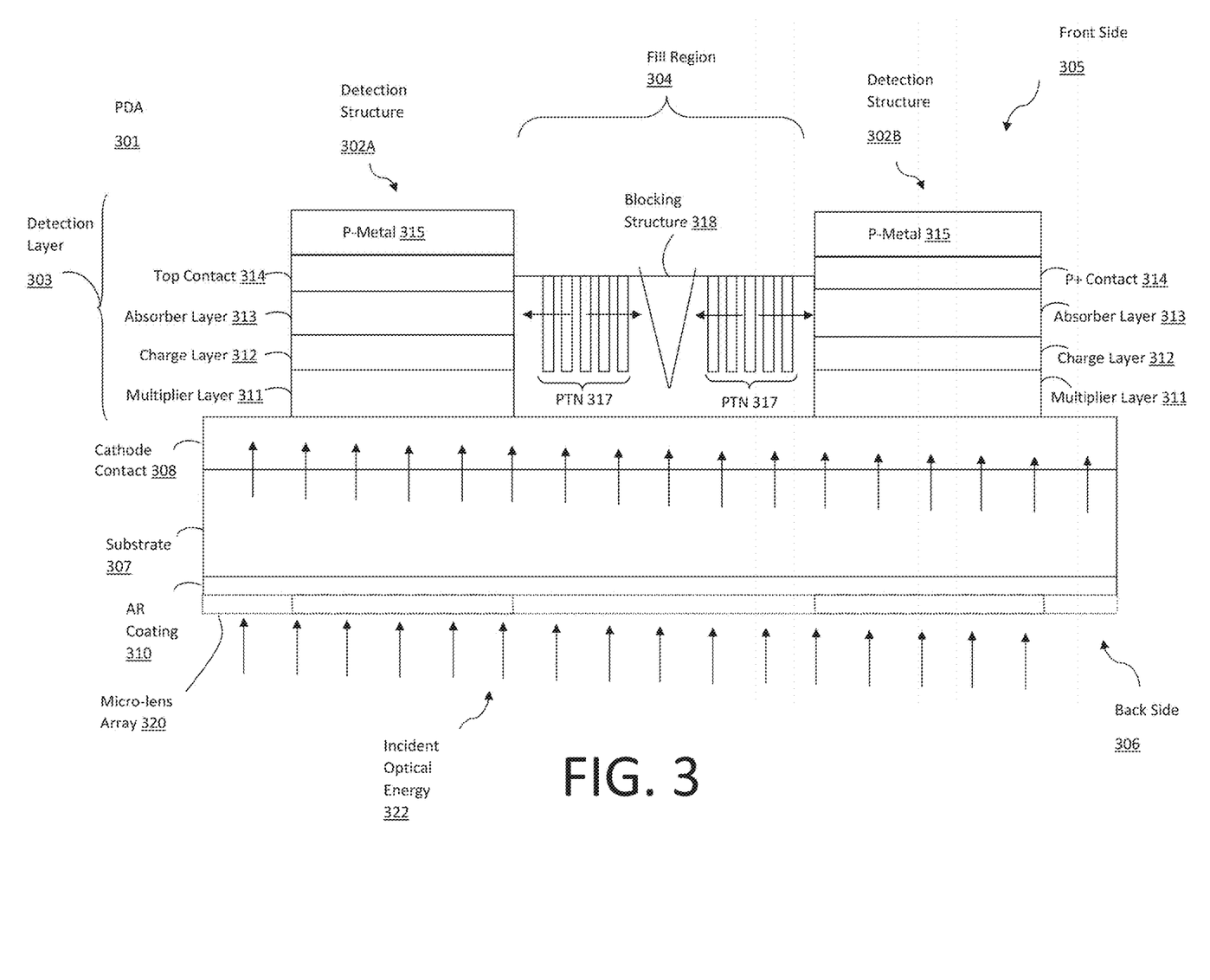
FIG. 3 is a diagram showing a cross-section view of a back-illuminated PDA including photon trapping nanostructures (PTN) in fill regions between adjacent detection structures according to one or more embodiments.

FIG. 3 is a conceptual diagram depicting a cross-sectional view of a PDA 301 that includes at least one plurality of photon trapping nanostructures (PTN) 317 according to one or more aspects of this disclosure. For simplicity, PDA 301 depicted in FIG. 3 includes only two adjacent detection structures 302A and 302B. In some examples, PDA 301 may include far more detection structures 302 in spaced arrangement.

As shown in the example of FIG. 3, PDA 301 includes a front side 305 and a back side 306. In the example of FIG. 3, PDA 301 is back-illuminated, meaning the back side 306 is to be presented in a path of expected incident light, such as a point of pulsed light (e.g., from transmission lens 106 depicted in FIG. 1) reflected from one or more surfaces 108 in an environment to be mapped. In some examples, the various embodiments described herein may be applied in a back-illuminated PDA 301 as depicted in FIG. 3, and also FIGS. 4 and 5. In other examples, embodiments described herein may also be applied to front-illuminated PDA, for example PDA 601 depicted in FIG. 6.

Optical energy 322 incident on back side 306 travels through a substrate 307 and a cathode contact 308 coupled to a detection layer 303 at the front side 305 of PDA 301. In some embodiments, back side 306 includes an antireflective coating to minimize the amount of optical energy lost due to reflection. Substrate 307 may, in some examples, be made of a semiconductor substrate material such as a III-V semiconductor material, for example Indium Phosphide, GaSb, GaN, GaAs, InAs or Mercury Cadmium Telluride (MCT). Detection layer 303 is operable to absorb incident optical energy 322 via substrate 307, and convert the optical energy into an electrical signal that represents one or more characteristics of the received optical energy. Read out circuitry (not shown in FIG. 3) may be electrically coupled to the detection structures 302A and 302B to read such electrical signals, which may be used by read out circuitry and/or downstream processing circuitry and/or software to generate a point cloud representing a 3D map of an environment and/or objects in an environment.

As shown in the example of FIG. 3, detection layer 303 includes a plurality of detection structures 302A, 302B in spaced arrangement. In the example of FIG. 3, detection structures 302A, 302B each include a multiplier layer 311, a charge layer 312, an absorber layer 313, a top contact layer 314, and a metal contact layer 315, which are shown for descriptive purposes and are not drawn to scale. In some examples, the top contact layer 314 and metal layer are P-type, while the cathode contact layer is N-type. In other examples, the top contact layer 314 and metal layer 315 are N-Type, while the cathode contact layer is P-type. Additionally, substrate layer 307 may be N-type, or may be P-type.

Absorber layer 313 absorbs optical energy in the form of photons via substrate 307, and creates electronic carriers that pass through charge layer 312 into multiplier layer 311 which amplifies, or multiplies the received electronic charge and generates an electrical signal indicative of characteristics of the received optical energy, such as a magnitude of the received energy, and outputs the electrical signal via cathode contact 308, which may be coupled to read out circuitry (e.g., 119 depicted in FIG. 1). Absorber layer 313 may be made of a material particularly suitable to absorb, and therefore detect, optical energy. For example, for some LIDAR applications, absorber layer 313 may be formed of Gallium Antimonide (GaSb), InGaAs, InGaAsP, InGaAsSb, GaAs, InAs, InAlAs, InAlAsSb, Si, Ge, SiGe, or any other material suitable to absorb and detect light of a wavelength useful for the particular imaging application. In some examples, one or more layers of detector structures 302A, 302B, for example absorber layer 313, are formed of a material specifically configured to absorb a particular wavelength, or wavelengths, of light. In this manner, PDA 301 can distinguish optical energy from a LIDAR point source from other sources of optical energy.

Read out circuitry reads electrical signals from detection structures 302A, and 302B, and along with other information, uses it to generate a 3D representation in a scanned environment. For example, read out circuitry, or other downstream software or hardware, may identify an origin of incident optical energy 322, and by knowing a location and time of the source, determine an amount of time it took for incident optical energy 322 to travel from a LIDAR point source to a surface 108, and return to PDA 301, which may be referred to as time of flight (TOF). By calculating the TOF for multiple point sources reflecting off various surfaces in a scanned environment, a 3D map of the environment can be generated.

As shown in the FIG. 3, detection layer 303 includes a fill region 304 between adjacent detection structures 302A and 302B. The fill region 304 may be created, for example by etching, to create a desired spacing pitch between adjacent detection structures. In some examples, the fill region 304 is filled with a dielectric material that freely allows the movement of photons. As shown in FIG. 3, some incident optical energy 322 on backside 306 travels through substrate 307 and hits detection structures 302A, 302B directly, which may be absorbed by absorber region 313 and therefore detected. Other incident optical energy 322 travels through substrate 307, and passes through fill region 304, instead of being absorbed and therefore detected.

The amount of incident optical energy 322 lost due to passing through PDA 310 impacts the overall absorption efficiency of the PDA. In order to improve the PDA efficiency, traditional back illuminated PDA include a micro-lens array (320 in the example of FIG. 3, shown in dashed lines as an optional embodiment) at the back side 306 of the PDA, which includes a plurality of optical lenses each designed to channel incident optical energy 322 towards the detection structures 302A, 302B. Such micro-lens arrays 320, while they may improve the PDA absorption performance, typically require to be fabricated on separate substrates and must be carefully aligned and calibrated with active light, and securely fastened to the substrate 307. Performing such calibration in many cases involves substantial manual effort, and curing times may substantially delay production. As such, micro-lens array 320 may contribute substantially to the overall cost and complexity to produce PDA 301.

According to the example of FIG. 3, PDA 301 includes photon-trapping nanostructures (PTN) 317 formed in fill region 304. The PTN 317 may be formed in dielectric fill material of the fill region 304 by conventional semiconductor processing techniques, such as wet or dry etching. The PTN 317 are each formed with a predetermined width, or diameter for cylindrical, conical, or pyramidal PTN, that interacts with the wavelength of optical energy that detector structures 302A, 302B are configured to detect. In some examples, PTN 317 are formed with a consistent depth, which may be optimized to direct as much light perpendicularly towards detector structures 302A, 302B, and/or absorber layer 313. In other examples, PTN 317 may be formed of inconsistent depths.

In some examples, PTN 317 are formed in a first dielectric material in the fill region, and are then filled with a second dielectric material. In some examples, the second dielectric material has a substantially lower dielectric constant than the first dielectric material. In other examples, PTN 317 are not filled.

PTN 317 may be formed in fill region 304 with a diameter (or width) and/or pitch (i.e., spacing between adjacent PTN) that cause photons that travel into the fill region 304 through substrate 307 to disperse in a perpendicular direction (e.g., perpendicular relative to a direction of incident light), or laterally in fill region 304, with little or no delay. In one example, the cylindrical PTN 317 may consist of 800 nm holes to disperse and/or detect 2,000 nm wavelengths. As shown in FIG. 3, by doing so, PTN 317 cause optical energy in fill region 301 to disperse toward detector structures 302A, 302B, and at least some of the redirected optical energy to reach absorber layer 313. Thus, incident optical energy that would otherwise be lost can be detected by PDA 301, improving absorption efficiency of the PDA 301.

As also shown in FIG. 3, according to some optional embodiments, fill region 304 further includes a blocking structure 318. As shown in the example of FIG. 3, PTN 317 may cause incident optical energy 322 at the fill region to disperse in a perpendicular direction both towards and away from an individual detector structure 302A. According to these optional embodiments, blocking structure 318 causes photons to disperse perpendicularly away from an adjacent detector structure 302A to be reflected back to the detector structure 302A, thereby further reducing an amount of optical energy lost in fill region 304 and/or reduce crosstalk. In some examples, blocking structure 318 is optimized to direct as much light as possible back to an adjacent detection structure. For example, blocking structure 318 may be coated with a material or materials that are highly optically reflective at the wavelength or wavelengths (e.g., gold) that the PDA 310 is adapted to detect, and/or may be arrange at an ideal angle or angle(s) to reflect as much light as possible for absorption by detection structures 302A, 302B.

The example of FIG. 3 further includes a micro-lens array 320 as an optional embodiment in dashed lines at the back side 306 of the substrate 307. Traditional PDA may include micro-lens array 320, in order to improve an efficiency of the PDA by reducing an amount of energy lost in PDA fill regions 304. In some examples, PTN 317 may reduce a need for micro-lens array 320 to be highly accurate, and/or obviate the need to incorporate micro-lens array at all. As such, the various embodiments described herein may significantly reduce the relatively high cost and complexity associated with producing PDA 301.

Figure 4:
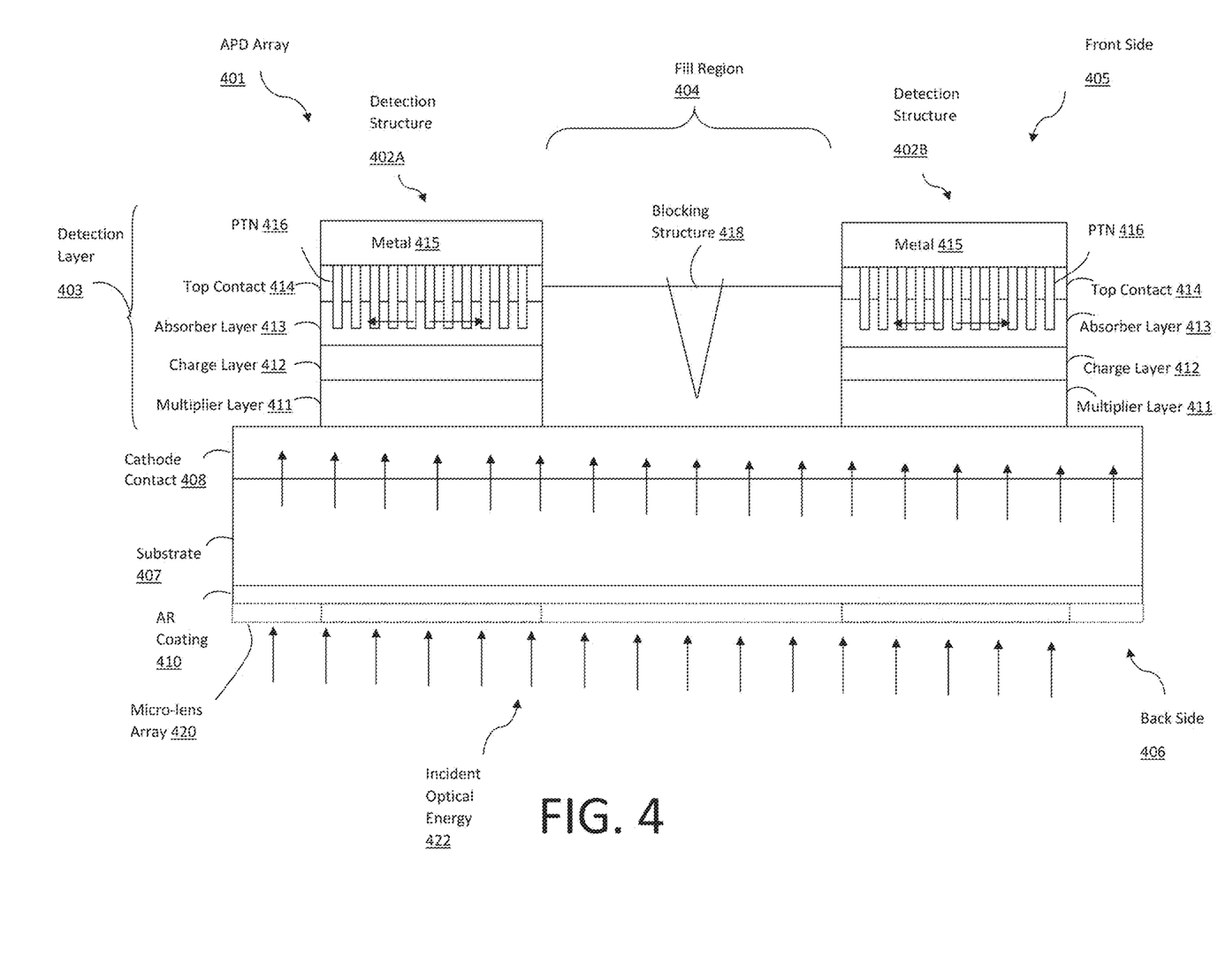
FIG. 4 is a diagram showing a cross-section view of a back-illuminated PDA including PTN in absorber layers of adjacent detection structures according to one or more embodiments.

FIG. 4 is a conceptual diagram depicting a cross-section view of an PDA 401 that includes at least one plurality of photon trapping nanostructures PTN 416 according to one or more aspects of this disclosure. For simplicity, PDA 401 depicted in FIG. 4 includes only two adjacent detection structures 402A and 402B. In some examples, PDA 401 may include far more detection structures 402 in spaced arrangement. PDA 401 includes a front side 405 and a back side 406. In the example of FIG. 4, PDA 401 is back-illuminated, meaning the back side 406 is to be presented in a path of expected incident light 422. Optical energy 422 incident on back side 406 travels through a substrate 407 and a cathode contact 408 coupled to a detection layer 403 at the front side 405 of PDA 401. In some embodiments, back side 406 includes an antireflective coating to minimize the amount of optical energy lost due to reflection. Substrate 407 may, in some examples, be made of a wide bandgap semiconductor material, such as a III-V semiconductor material, for example Indium Phosphide, GaSb, InAs or GaAs. Detection layer 403 is operable to receive incident optical energy 422 via substrate 407, and convert that received optical energy into an electrical signal that represents one or more characteristics of the received optical energy. Read out circuitry (not shown in FIG. 4) may be electrically coupled to the detection structures 402A and 402B to read such electrical signals.

In the example of FIG. 4, detection structures 402A, 402B each include a multiplier layer 411, a charge layer 412, an absorber layer 413, a top contact layer 414, and a metal layer 415, which are shown for descriptive purposes and are not drawn to scale. In some examples, the top contact layer 414 and metal layer are P-type, while the cathode contact layer is N-type. In other examples, the top contact layer 414 and metal layer 415 are N-Type, while the cathode contact layer is P-type. Additionally, substrate layer 407 may be N-type, or may be P-type.

Absorber layer 413 absorbs optical energy via substrate 407 and generates an electronic carriers that pass through charge layer 412 and multiplier layer 411 receives and the electronic charge and amplifies, or multiplies them, generating an electrical signal indicative of characteristics of the received energy, such as a magnitude of the received energy, and outputs the electrical signal via top contact layer 414 and metal layer 415, which may be coupled to read out circuitry (e.g., 119 depicted in FIG. 1). Absorber layer 413 may be made of a material particularly suitable to absorb, and therefore detect, optical energy. For example, for some LIDAR applications, absorber layer 413 may be formed of Gallium Antimonide (GaSb), InGaAs, InGaAsP. InGaAsSb, GaAs, InAs, InAlAs, InAlAsSb, Si, Ge, SiGe, or any other material suitable to absorb and detect light of a wavelength useful for the particular imaging application. In some examples, one or more layers of detector structures 402A, 402B, for example absorber layer 413, are formed of a material specifically configured to absorb a particular wavelength, or wavelengths, of light.

PDA 401 includes a detection layer 403 that includes a plurality of PTN 416, in detector structures 402A, 402B of the detection layer 403. In the example of FIG. 4. PTN 416 are formed in the absorber layer 413, as well as top contact layer 414. In other examples, PTN 416 may be formed in just the absorber layer 413 and not top contact layer 414. According to this example, PTN 416 may be formed by wet or dry etching. The PTN 416 may be each formed with a predetermined width, or diameter for cylindrical, conical, or pyramidal PTN, that interacts with the wavelength of optical energy that detector structures 402A, 402B are configured to detect. In some examples, PTN 416 are formed with a consistent depth, which may be optimized to direct as much light perpendicularly towards detector structures 402A, 402B, and/or absorber layer 413. In other examples, PTN 416 may be formed of inconsistent depths.

FIG. 4 depicts an embodiment where a back-illuminated PDA 401 includes PTN 417 formed in an absorber layer 413 of the PDA, which may improve an absorption efficiency of PDA 401. According to these examples, PTN 417 cause optical energy incident on the PDA detection structures 402A, 402B to disperse perpendicularly (e.g., perpendicular relative to a direction of incident light) in the absorber layer. In some examples, PTN 417 may be formed in absorber layer with a diameter (or width) and/or pitch (i.e., spacing between adjacent PTN 417) that cause photons that reach absorber layer 413 to disperse in a perpendicular direction (e.g., perpendicular relative to a direction of incident light), or laterally in absorber layer 413, with little or no delay. Because PTN 417 cause photons to disperse perpendicularly, absorber layer 413 may absorb more photons, and therefore detect more of incident optical energy 422. For example, in a typical photo detector, such as an avalanche photo detector, as much as 60% of light incident on PDA detection structures might be lost as it passes through the detector undetected. By including PTN 417 in absorber layer 413, up to 100% of optical energy incident upon detection structures 402A, 402B might be absorbed and therefore detected.

As also shown in FIG. 4, according to some optional embodiments, fill region 404 further includes a blocking structure 418, which may be coated with a reflective material such as gold. As shown in the example of FIG. 4. PTN 417 may cause incident optical energy 422 at the fill region to disperse in a perpendicular direction both towards and away from an individual detector structure 402A. According to these optional embodiments, blocking structure 418 causes photons to disperse perpendicularly away from an adjacent detector structure 402A to be reflected back to the detector structure 402A, thereby further reducing an amount of optical energy lost in fill region 404. The example of FIG. 3 further includes a micro-lens array 420 as an optional embodiment in dashed lines at the back side 406 of the substrate 407.

Figure 5:
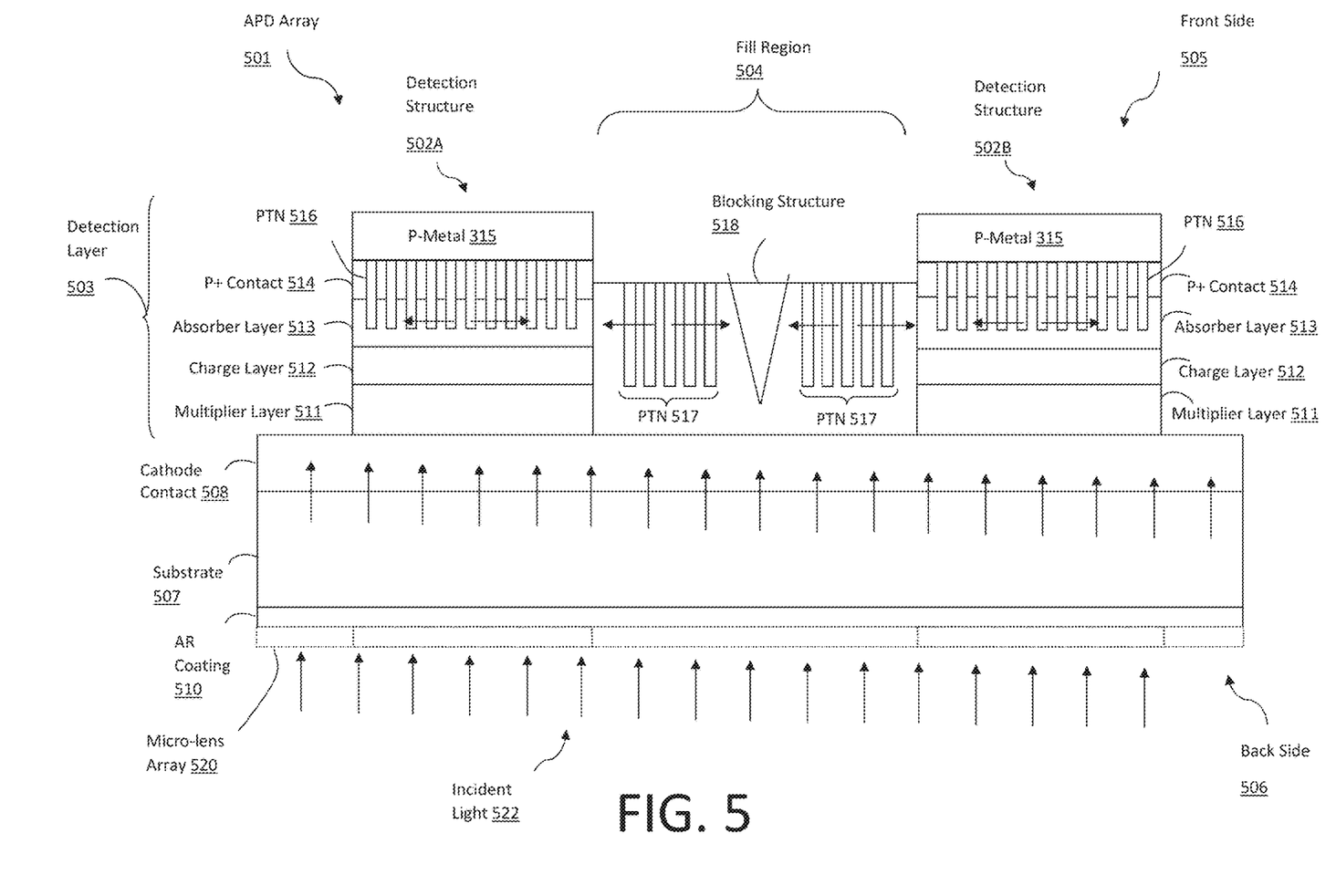
FIG. 5 is a diagram showing a cross-section view of a back-illuminated PDA including a first plurality of PTN in fill regions between adjacent detection structures, and a second plurality of PTN in absorber layers of adjacent detection structures according to one or more embodiments.

FIG. 5 is a diagram depicting a cross-sectional view of a PDA 501 that includes a detection layer 503 that includes first and second pluralities of PTN 517, 516. For simplicity, PDA 501 depicted in FIG. 5 includes only two adjacent detection structures 502A and 502B. In some examples, PDA 501 may include far more detection structures 502 in spaced arrangement. PDA 501 includes a front side 505 and a back side 506. In the example of FIG. 5, PDA 501 is back-illuminated, meaning the back side 506 is to be presented in a path of expected incident light 522. Optical energy 522 incident on back side 506 travels through a substrate 507 via a cathode contact 508 coupled to a detection layer 503 at the front side 505 of PDA 501. In this embodiment, back side 506 includes an antireflective coating to minimize the amount of optical energy lost due to reflection. Substrate 507 may, in some examples, be made of a wide bandgap semiconductor material, such as a III-V semiconductor material, for example Indium Phosphide. Detection layer 503 is operable to receive incident optical energy 522 via substrate 507, and convert that received optical energy into an electrical signal that represents one or more characteristics of the received optical energy.

As shown in the example of FIG. 5, detection layer 503 includes a plurality of detection structures 502A, 502B in spaced arrangement. In the example of FIG. 5, detection structures 502A, 502B each include a multiplier layer 511, a charge layer 512, an absorber layer 513, a top contact layer 514, and a metal layer 515, which are shown for descriptive purposes and are not drawn to scale. In some examples, the top contact layer 514 and metal layer are P-type, while the cathode contact layer is N-type. In other examples, the top contact layer 514 and metal layer 515 are N-Type, while the cathode contact layer is P-type. Additionally, substrate layer 507 may be N-type, or may be P-type.

Absorber layer 513 absorbs optical energy via substrate 507 and generates electronic carriers that pass through charge layer 512 to multiplier layer 511. In some embodiments, multiplier layer 511 receives the electronic charge and amplifies, or multiplies them, generating an electrical signal indicative of characteristics of the received energy, such as a magnitude of the received energy, and outputs the electrical signal via top contact layer 514 and metal layer 515, which may be coupled to read out circuitry. Absorber layer 513 may be made of a material particularly suitable to absorb, and therefore detect, optical energy. For example, for some LIDAR applications, absorber layer 513 may be formed of Gallium Antimonide (GaSb), InGaAs, InGaAsP, InGaAsSb, GaAs, InAs, InAlAs, InAlAsSb, Si, Ge, SiGe, or any other material suitable to absorb and detect light of a wavelength useful for the particular imaging application. In some examples, one or more layers of detector structures 502A, 502B, for example absorber layer 513, are formed of a material specifically configured to absorb a particular wavelength, or wavelengths, of light. In this manner, PDA 501 can distinguish optical energy from a LIDAR point source from other sources of optical energy.

As shown in FIG. 5, detection layer 503 includes a first plurality of PTN 516 in detector structures 502A, 502B, and a second plurality of PTN 517 within a fill region 504 between adjacent detection structures 502A, and 502B. Like the example of FIG. 3, PTN 517 cause incident light 522 in fill region 504 to disperse in a perpendicular direction towards detection structures 502A, 502B, which may enable PDA 501 to absorb optical energy that otherwise would have been lost. In addition, like PDA 401 depicted in FIG. 4, PDA 501 includes PTN 516 in detection structures 502A, 502B, in absorber layer 513. According to this embodiment, PDA 501 not only recovers incident optical energy at fill region 504, absorber layer 513 may absorb a higher percentage of both photons incident on the detection structures 502A, 502B themselves, as well as photons redirected from fill region 504. Accordingly, PDA 501 may demonstrate even greater improvements in absorption efficiency, in comparison to PDA 301, 401 depicted in FIGS. 3 and 4.

As also shown in FIG. 5, according to some optional embodiments, fill region 504 further includes a blocking structure 518, which may be coated with a reflective material such as gold. According to these embodiments, blocking structure 518 causes photons to disperse perpendicularly away from an adjacent detector structure 502A to be reflected back to the detector structure 502A, thereby further reducing an amount of optical energy lost in fill region 504. The example of FIG. 5 further includes a micro-lens array 520 as an optional embodiment in dashed lines at the back side 506.

Figure 6:
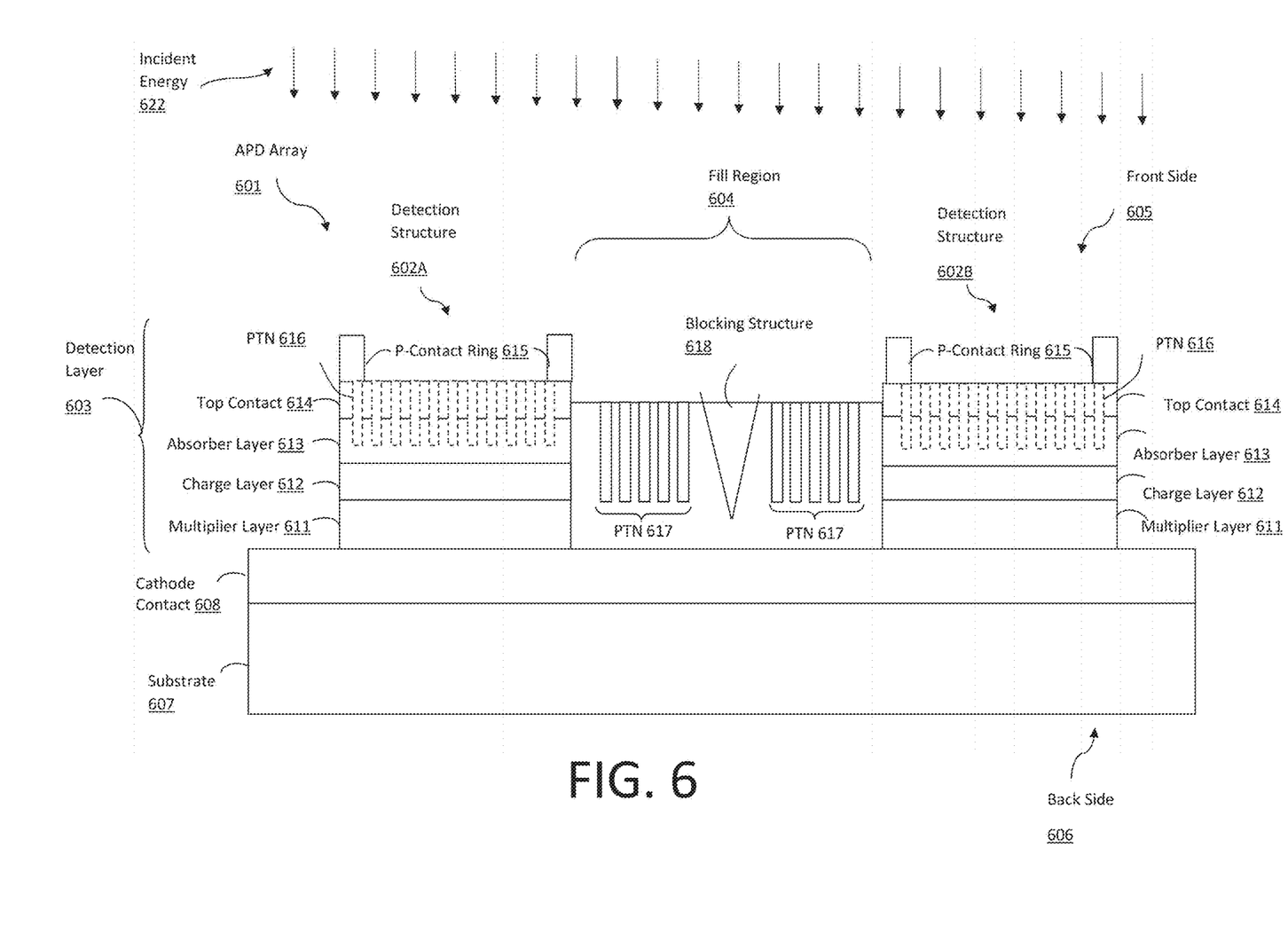
FIG. 6 is a diagram showing a cross-section view of a front-illuminated PDA including a first plurality of PTN in fill regions between adjacent detection structures, and an optional second plurality of PTN in absorber layers of adjacent detection structures according to one or more embodiments.

FIG. 6 is a conceptual diagram depicting a side view of a front-illuminated PDA 601 that includes at least one plurality of PTN 617 according to one or more aspects of this disclosure. As shown in the example of FIG. 6, PDA 601 includes a front side 605 and a back side 606. PDA 601 is a front-illuminated PDA, meaning the front side 605 is to be presented in a path of expected incident light, such as a point of backscattered light (e.g., from transmission lens 106 depicted in FIG. 1) reflected from one or more surfaces 108 in an environment to be mapped.

For simplicity, PDA 601 depicted in FIG. 6 includes only two adjacent detection structures 602A and 602B. In some examples, PDA 601 may include far more detection structures 602 in spaced arrangement. Substrate 607 may, in some examples, be made of a wide bandgap semiconductor material, such as a III-V semiconductor material, for example Indium Phosphide. Detection layer 603 is operable to absorb incident optical energy 622 at front side 605, and convert that absorbed optical energy into a representative electrical signal.

In the example of FIG. 6, detection structures 602A, 602B each include a multiplier layer 611, a charge layer 612, an absorber layer 613, a top contact layer 614, and a metal layer 615, which are shown for descriptive purposes and are not drawn to scale. In some examples, the top contact layer 614 and metal layer are P-type, while the cathode contact layer is N-type. In other examples, the top contact layer 614 and metal layer 615 are N-Type, while the cathode contact layer is P-type. Additionally, substrate layer 607 may be N-type, or may be P-type.

Optical energy 622 incident on front side 605 is absorbed by detection layer 603, which is also located at the front side 605 of PDA 601. As shown in the FIG. 6, detection layer 603 includes a fill region 604 between adjacent detection structures 602A and 602B. Some incident optical energy 622 on front side 605 hits detection structures 602A, 602B directly, which may be absorbed by absorber region 613 and therefore detected. Other incident optical energy 622 passes through substrate 607, instead of being detected.

According to the example of FIG. 6, PTN 617 are formed in the fill region 604 with a diameter (or width) and pitch that cause photons that reach fill region 604 disperse in a perpendicular direction, or laterally, in fill region 604. As shown in FIG. 6, by doing so, PTN 617 cause optical energy in fill region 601 to disperse toward detector structures 602A, 602B, and at least some of the redirected optical energy to reach absorber layer 613. Thus, incident optical energy that would otherwise be lost can be detected by PDA 601, thereby improving overall absorption efficiency of the PDA 601.

As also shown in FIG. 6, according to some optional embodiments, the PTN 617 described above are a first plurality of PTN in the fill region, and detection layer 603 further includes a second plurality of PTN 616 (shown in dashed lines as an optional embodiment in FIG. 6) in detector structures 602A, 602B. According to these embodiments, PDA 601 may not only recover incident optical energy at fill region 304, but absorber layer 413 absorbs a higher percentage of both energy incident on the detection structures 402A, 402B themselves, as well as energy redirected from fill region 604. Accordingly, PDA 601 may demonstrate even greater improvement to fill factor, and therefore overall absorption efficiency, in comparison to traditional front-illuminated PDA.

According to some embodiments not depicted herein, a front-illuminated PDA 601 as depicted in FIG. 6, or a back-illuminated PDA 301, 401, 501 depicted in FIGS. 3-5, may be made with a low fill factor (large spacing between detection structures). In some examples, such a PDA 601 may accommodate one or more control circuits formed in fill regions 604. According to these embodiments, these control circuits may be covered with a dielectric film (e.g., silicon nitride), and the dielectric film may be etched to include a plurality of PTN as described herein, that cause light incident on the front-illuminated PDA surface to disperse towards detection structures. Such an approach may provide a PDA with high, single-photon level sensitivity, low noise, low crosstalk, and/or a small form factor.

Figure 7:
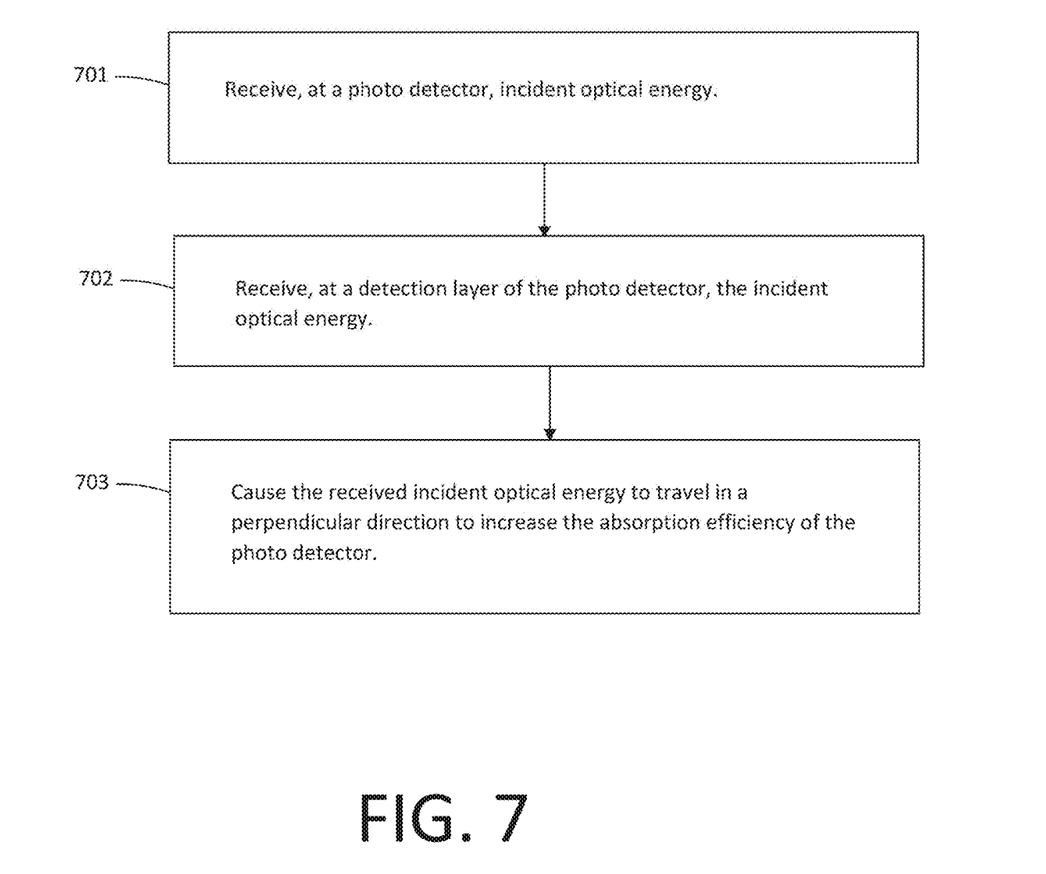
FIG. 7 is a flow diagram depicting one example of a method of detecting optical energy according to one or more embodiments.

FIG. 7 is a flow diagram depicting a method of operating a photo detector array (PDA) according to one or more aspects of this disclosure. As shown in FIG. 7, the method includes receiving, at a photodetector surface, incident optical energy with an incident direction (701). The method further includes absorbing, at a detection layer of the photo detector, the incident optical energy (702). In some examples, the PDA is a back-illuminated PDA 301, 401, 501 where the incident optical energy travels through a substrate to reach the detection layer. In other examples, the PDA is a front-illuminated PDA 601 where optical energy incident on a front side of the PDA reaches the detection layer at the front side of the PDA.

As shown in FIG. 7, the method further includes causing, using at least one plurality of photon-trapping nanostructures (PTN) to cause the optical energy at an incident direction to disperse in a direction perpendicular to the incident direction, to increase the absorption efficiency of the PDA (703). For example, for front or back-illuminated PTN, the plurality of PTN may be in fill regions of the PDA, and cause the optical energy at the fill regions to disperse towards detection structures in the detection layer, to be absorbed instead of lost.

In other examples, the PDA is a back illuminated PDA, and includes a plurality of PTN in detection structures of the detection layer. According to these examples, the PTN cause optical energy to disperse in a perpendicular, or lateral direction in an absorber layer of the detection structures, thereby increasing an amount of energy absorbed by the detection structures. In still other examples, the plurality of PTN in the detection structures are a first plurality of PTN, and the PDA further includes a second plurality of PTN in detection structures of the detection layer, in addition to the first plurality of PTN.

Figure 8A:
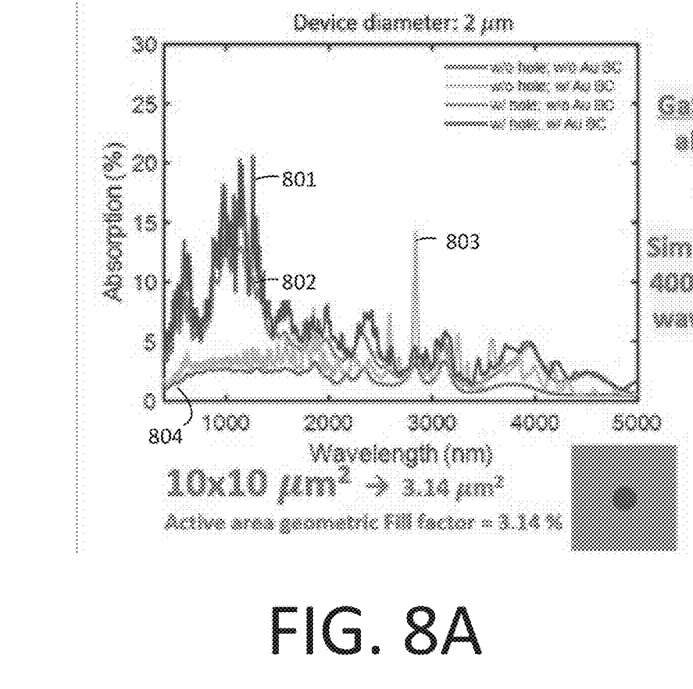
FIGS. 8A and 8B are graphs depicting the results of simulations showing absorption efficiency of APD that include nanostructures of different diameters under varied conditions one or more embodiments.
Figure 8B:
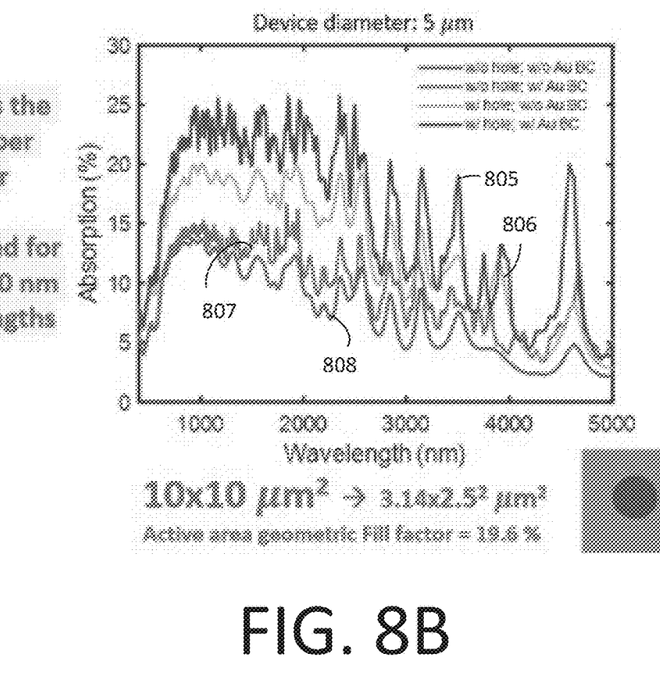

FIG. 8 is a graphical diagram showing the results of simulations run with PDA models that include PTN within a detection layer of the PDA. The plots represent the percentage of absorption efficiency at various wavelengths of light, ranging from 400-5000 nanometers with a GaSb absorber layer.

The leftmost graph in FIG. 8 depicts the results when PTN with a diameter of 3.14 microns-squared in a 10×10 square micron area, representing a fill factor of 3.14%. As shown in the graph, plot 804 depicts the absorption efficiency of an PDA structure with no PTN and without a gold-coated blocking structure (e.g., 318) in the fill region (e.g., 304). Plot 803 shows the absorption efficiency with no PTN in the fill region, but with a gold-coated blocking structure. Plot 802 shows the absorption efficiency with PTN in the fill region, but no gold-coated blocking structure, and plot 801 shows the absorption efficiency with PTN and a gold-coated blocking structure in the fill region.

The rightmost graph in FIG. 8 depicts the results when PTN with a diameter of 3.14×2.5 microns square in a 10×10 square micron area, representing a fill factor of 19.6%. As shown in the graph, plot 808 depicts the absorption efficiency of a PDA structure with no PTN or blocking structure (e.g., 314) in the fill region (e.g., 304). Plot 807 shows the absorption efficiency with no PTN in the fill region, but with gold-coated a blocking structure. Plot 806 shows the absorption efficiency with PTN in the fill region, but no gold-coated blocking structure, and plot 805 shows the absorption efficiency with PTN in the detection layer and a gold-coated blocking structure.

As shown in the leftmost graph, especially at lower frequencies (less than 1500 nm), the simulated PDA structures that include PTN (plots 801 and 802) consistent with this disclosure provide a greater absorption efficiency than PDA structures without PTN (plots 803, 804) in the fill region. As shown in the rightmost graph, at PTN of greater width (diameter) may demonstrate even more improvement to absorption efficiency in comparison to PDA that don't include PTN.

Figures 9A, 9B:
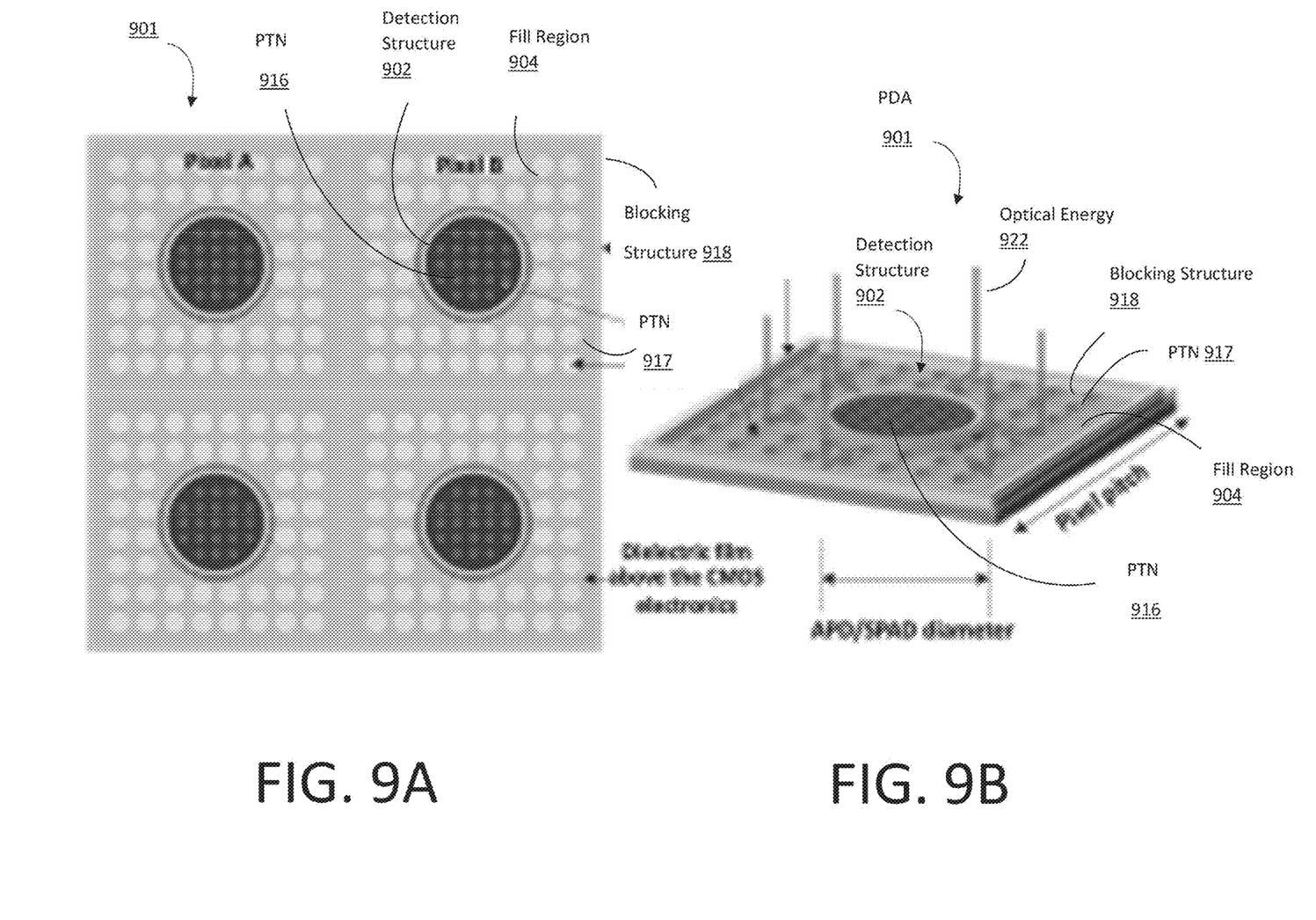
FIGS. 9A and 9B are diagrams depicting a front-illuminated PDA including a first plurality of PTN in fill regions between adjacent detection structures, and a second plurality of PTN in absorber layers of adjacent detection structures according to one or more embodiments.

FIGS. 9A and 9B are diagrams depicting a front-illuminated PDA 901 including at least one plurality of PTN according to one or more embodiments. PDA 901 is front-illuminated, meaning that it is adapted to measure optical energy 922 incident on a front-side of PDA 901 via detection structures 902 in a detection layer (not shown in FIGS. 9A and 9B) of the PDA 901. FIG. 9A is a top-down view of a PDA 901, that includes a plurality of detection structures 902 and fill regions 904 between adjacent detection structures 902 that make up respective pixels of the PDA, each separated by optional blocking structures 918 in fill regions 904. FIG. 9B is a side perspective view of one pixel of PDA 901.

As shown in FIGS. 9A and 9B, PDA 901 includes a fill region 904 between adjacent detection structures 902. Some incident optical energy 922 hits detection structures 902 directly, which may be absorbed by detection structures 902 and therefore detected.

According to the example of FIGS. 9A and 9B, PTN 917 are formed in the fill region 904 with a diameter (or width) and pitch that cause photons that reach fill region 904 to disperse in a perpendicular direction, or laterally, in fill region 904 as shown by the red arrows in FIG. 9B. PTN 917 cause optical energy in fill region 901 to disperse laterally toward detector structures 902 and at least some of the redirected optical energy be detected by PDA 901, thereby improving overall absorption efficiency of the PDA 901.

As also shown in FIGS. 9A and 9B, according to some optional embodiments, the PTN 917 described above are a first plurality of PTN in the fill region, and PDA 901 further includes a second plurality of PTN 916 in detector structures 902. According to these embodiments, PDA 901 may not only recover incident optical energy at fill region 904, but detection structures 902 may absorb a higher percentage of both energy incident on the detection structures 902 themselves, as well as energy redirected from fill region 902. Accordingly, PDA 901 may demonstrate even greater improvement to fill factor, and therefore overall absorption efficiency, in comparison to traditional front-illuminated PDA.

According to some embodiments not depicted herein, a front-illuminated PDA 901 may be made with a low fill factor (large spacing between detection structures). In some examples, such a PDA 901 may accommodate one or more electrical components (not shown in FIGS. 9A and 9B), such as control circuits, formed in fill regions 904. According to these embodiments, these electrical components (for example implemented in Complimentary Metal Oxide Semiconductor (CMOS) technology) may be covered with a dielectric film (e.g., silicon nitride), and the dielectric film may be etched to include a plurality of PTN 917 as described herein, that cause light incident on the front-illuminated PDA surface to disperse towards detection structures as shown by the red arrows in FIG. 9B. Such an approach may provide a PDA 901 with high, single-photon level sensitivity, low noise, low crosstalk, and/or a small form factor while increasing its optical collection area and making optical coupling simpler and therefore lower cost.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

ELEMENT/COMPONENT LIST

- 100—Lidar System
- 101—Avalanche Photo Detector (APD)
- 102—Detection Structure
- 103—Controller
- 104—Pulsed Laser Diode
- 106—Transmission Lens
- 108—Object
- 114—Photon-Trapping Nanostructures
- 116—Lens Array
- 117—Substrate
- 118—Detection Layer
- 119—Read Circuit
- 201—APD
- 202—Back Side Fill Region
- 216—Micro-lens
- 301—APD
- 302A, 302B—Adjacent Detection Structures
- 303—Detection Layer
- 304—Fill Region
- 305—Front Side
- 306—Back Side
- 307—Substrate
- 308—Cathode Contact
- 310—AR Coating
- 311—Multiplier Layer
- 312—Charge Layer
- 313—Absorber Layer
- 314—Top Contact
- 315—Metal
- 317—Photon-Trapping Nanostructures
- 318—Blocking Structure
- 320—Micro-Lens Array
- 322—Incident Light
- 401—APD
- 402A, 402B—Adjacent Detection Structures
- 403—Detection Layer
- 404—Fill Region
- 405—Front Side
- 406—Back Side
- 407—Substrate
- 408—Cathode Contact
- 410—AR Coating
- 411—Multiplier Layer
- 412—Charge Layer
- 413—Absorber Layer
- 414—Top Contact
- 415—Metal
- 416—Photon-Trapping Nanostructures
- 418—Blocking Structure
- 420—Micro-Lens Array
- 422—Incident Light
- 501—APD
- 502A, 502B—Adjacent Detection Structures
- 503—Detection Layer
- 504—Fill Region
- 505—Front Side
- 506—Back Side
- 507—Substrate
- 508—Cathode Contact
- 510—AR Coating
- 511—Multiplier Layer
- 512—Charge Layer
- 513—Absorber Layer
- 514—Top Contact
- 515—Metal
- 516—Second Plurality of Photon-Trapping Nanostructures
- 517—First Plurality of Photon-Trapping Nanostructures
- 518—Blocking Structure
- 520—Micro-Lens Array
- 522—Incident Light
- 601—APD
- 602A, 602B—Adjacent Detection Structures
- 603—Detection Layer
- 604—Fill Region
- 605—Front Side
- 606—Back Side
- 607—Substrate
- 608—Cathode Contact
- 610—AR Coating
- 611—Multiplier Layer
- 612—Charge Layer
- 613—Absorber Layer
- 614—Top Contact
- 615—Metal
- 616—Second Plurality of Photon-Trapping Nanostructures
- 617—First Plurality of Photon-Trapping Nanostructures
- 618—Blocking Structure
- 620—Micro-Lens Array
- 622—Incident Light 701-703 Method
801-808 Graphs
901—APD
902—Detection Structures
904—Fill Region
916—Second Plurality of Photon-Trapping Nanostructures
917—First Plurality of Photon-Trapping Nanostructures
918—Blocking Structure
922—Incident Light

The invention claimed is:

1. Photo Detector Array (PDA), comprising:
a back side that receives optical energy incident on the back side at an incident direction; and
a front side that includes a detection layer that absorbs the optical energy incident on the back side via a substrate, wherein the detection layer includes a plurality of detector structures and fill regions between adjacent detector structures, wherein the fill regions are filled with a dielectric material and include a plurality of nanostructures which cause optical energy incident on the fill regions to disperse perpendicularly to the incident direction to be absorbed by an absorber layer of the plurality of detector structures.

2. The PDA of claim 1, wherein the fill regions further include a blocking structure that causes optical energy dispersed perpendicularly away from an adjacent detection structure to be reflected back towards the adjacent detection structure.

3. The PDA of claim 1, wherein the optical energy is not received via a micro-lens array at the back side.

4. The PDA of claim 1, wherein the plurality of nanostructures is a first plurality of nanostructures, and wherein the plurality of detection structures include an absorber layer that includes a second plurality of nanostructures that cause the optical energy received at the plurality of detection structure to disperse perpendicularly to the incident direction within the absorber layer.

5. The PDA of claim 1, wherein the plurality of nanostructures are filled with a dielectric material.

6. The PDA of claim 1, the fill region is filled with a first material with a first dielectric constant, and the plurality of nanostructures are filled with a second material with a second dielectric constant substantially less than the first dielectric constant.

7. The PDA of claim 1, wherein the nanostructures have a diameter less than a wavelength of the incident optical energy.

8. The PDA of claim 1, where the PDA is a Mesa-Type PDA that includes one or more detection structures selected from the group consisting of:
  PIN detectors;
  Schottky detectors;
  solar cell detectors; and
  nBn-type detectors.

9. The PDA of claim 1, wherein the fill regions separate adjacent detection structures from one another.

10. The PDA of claim 1, wherein the fill regions do not include an absorber layer.

11. The PDA of claim 1, wherein the adjacent detector structures absorb the optical energy incident on the back side via the substrate, and the fill regions do not absorb the optical energy incident on the back side via the substrate.

12. A method, comprising:
receiving, at a back surface of a photo detector array (PDA), incident optical energy in an incident direction;
absorbing, at adjacent detection structures of the photo detector, the optical energy; and
using photon-trapping nanostructures to cause optical energy incident on fill regions between adjacent detection structures that are filled with a dielectric material to disperse perpendicularly to the incident direction towards the adjacent detection structures.

13. The method of claim 12, further comprising:
wherein the photon-trapping nanostructures are a first plurality of photon trapping nanostructures, and further comprising using a second plurality of photon-trapping nanostructures to cause optical energy received at an absorber layer of the detection structures to disperse perpendicularly to the incident direction within the absorber layer.

14. The method of claim 12, wherein the fill regions separate adjacent detection structures from one another.

15. The method of claim 12, wherein the fill regions do not include an absorber layer.

16. The method of claim 12, wherein the adjacent detector structures absorb the optical energy incident on the back surface via a substrate, and the fill regions do not absorb the optical energy incident on the back surface via the substrate.

17. A Photo Detector Array (PDA), comprising:
a back side that includes a substrate; and
a front side that includes a detection layer that absorbs optical energy incident on the front side in an incident direction, wherein the detection layer includes a plurality of detector structures and fill regions between adjacent detector structures, wherein the fill regions are filled with a dielectric material and include a plurality of nanostructures, and wherein the plurality of nanostructures cause optical energy received at the fill region to disperse perpendicularly to the incident direction to be absorbed by an absorber layer of the plurality of detector structures.

18. The PDA of claim 17, wherein the plurality of nanostructures is a first plurality of nanostructures, and further comprising:
a second plurality of nanostructures in an absorber layer that cause the optical energy received at the plurality of detection structures to disperse perpendicularly to the incident direction within the absorber layer.

19. The PDA of claim 17, further comprising:
at least one electrical circuit disposed in the fill regions.

20. The PDA of claim 19, further comprising:
a dielectric film layer formed upon the electrical circuit, wherein the plurality of nanostructures is a first plurality of nanostructures, and further comprising another plurality of nanostructures in the dielectric film layer.

21. A photo detector structure, comprising:
a detection surface configured to receive incident light from an incident direction; and
an absorption layer that absorbs optical energy from the detection surface and generates an electrical signal indicative of characteristics of the received energy, and wherein the absorption layer absorbs optical energy dispersed towards the photo detector structure in a direction perpendicular to the incident direction by a plurality of photon trapping nanostructures arranged in a fill region adjacent to the photo detector structure that is filled with a dielectric material.

* * * * *